US 6,717,653 B2

(12) United States Patent
Iwamoto et al.

(10) Patent No.: US 6,717,653 B2
(45) Date of Patent: Apr. 6, 2004

(54) MOVING MECHANISM IN EXPOSURE APPARATUS, AND EXPOSURE APPARATUS HAVING THE SAME

(75) Inventors: Kazunori Iwamoto, Utsunomiya (JP); Hideki Nogawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/885,012

(22) Filed: Jun. 21, 2001

(65) Prior Publication Data

US 2002/0018195 A1 Feb. 14, 2002

(30) Foreign Application Priority Data

Jun. 23, 2000 (JP) ........................................ 2000-190140

(51) Int. Cl.⁷ .......................... G03B 27/58; G03B 27/62
(52) U.S. Cl. .......................................... 355/72; 355/75
(58) Field of Search ............................. 355/53, 50, 75, 355/72

(56) References Cited

U.S. PATENT DOCUMENTS

| | | | |
|---|---|---|---|
| 5,172,160 A | 12/1992 | Van Eijk et al. ............... 355/53 |
| 5,260,580 A | 11/1993 | Itoh et al. .................. 250/492.2 |
| 5,559,584 A | 9/1996 | Miyaji et al. ................... 355/73 |
| 5,596,437 A | 1/1997 | Heins ...................... 74/490.09 |
| 5,684,856 A | 11/1997 | Itoh et al. ...................... 378/34 |
| 5,858,587 A | * 1/1999 | Yamane et al. ................ 355/53 |
| 5,969,441 A | * 10/1999 | Loopstra et al. ............... 310/12 |
| 5,986,743 A | 11/1999 | Hanzawa ....................... 355/53 |
| 6,072,183 A | 6/2000 | Itoh et al. ................. 250/492.2 |
| 6,252,234 B1 | * 6/2001 | Hazelton et al. ........ 250/442.11 |
| 6,271,606 B1 | * 8/2001 | Hazelton .................. 250/491.1 |
| 6,449,030 B1 | * 9/2002 | Kwan ........................... 355/72 |
| 2001/0052967 A1 | * 12/2001 | Ogura et al. .................... 355/53 |

FOREIGN PATENT DOCUMENTS

| JP | 8-279458 | 10/1996 |
|---|---|---|
| JP | 9-289155 | 11/1997 |
| JP | 9-330874 | 12/1997 |

OTHER PUBLICATIONS

Korean Office Action dated Jun. 27, 2003, issued in a corresponding Korean patent application.

* cited by examiner

Primary Examiner—Russell Adams
Assistant Examiner—D. Ben Esplin
(74) Attorney, Agent, or Firm—Fitzpatrick, Cella, Harper & Scinto

(57) ABSTRACT

A moving mechanism includes a reference structure having a guide surface, a movable portion being movable along the guide surface, and an actuator having movable elements, provided at opposite end portions of the stage, and at least two stators. The stators are separated from each other and each is movable in two-dimensional directions by a reaction force produced as the movable portion is driven.

56 Claims, 12 Drawing Sheets

MOVING MECHANISM IN EXPOSURE APPARATUS, AND EXPOSURE APPARATUS HAVING THE SAME

FIELD OF THE INVENTION AND RELATED ART

This invention relates to a moving mechanism suitably usable in a high precision process such as a semiconductor lithographic process, for example, and a stage system having such a mechanism or an exposure apparatus having such a stage system.

The manufacture of semiconductor devices or the like uses an exposure apparatus of a step-and-repeat type (called a stepper) in which a pattern of an original (reticle or mask) is sequentially printed on different exposure regions on a substrate (wafer or glass plate) through a projection optical system while moving the substrate stepwise. An alternative is a step-and-scan type exposure apparatus (called a scanner) in which stepwise motion and scanning exposure are repeated so that the printing exposure is repeated to plural regions on a substrate. Particularly, the step-and-scan type uses a portion of the projection optical system which is relatively close to its optical axis and, therefore, it enables high precision and wide view angle exposure of a fine pattern.

These exposure apparatus have a stage unit (wafer stage or reticle stage) for moving a wafer or a reticle at a high speed. Here, moving the stage causes a reaction force of an inertia in response to acceleration or deceleration. If this is transmitted to a base table, it produces swinging motion or vibration of the base table. In response, the natural vibration of the mechanical system of the exposure apparatus is excited, to cause high frequency vibration, which adversely affects the high speed and high precision positioning of the stage.

Many proposals have been made to solve such a problem. Examples are U.S. Pat. Nos. 5,260,580, 5,684,856 and 6,072,183, showing systems in which a stator of a linear motor for moving a stage is supported by a floor, independently of a stage base table, thereby to prevent swinging motion of the stage base table due to a reaction force. U.S. Pat. No. 5,172,160 shows a system in which, to a machine frame for supporting a wafer stage and a projection lens, a force actuator for producing a force in a horizontal direction is used to apply a compensating force equivalent to a reaction force caused in response to the stage motion, thereby to reduce the swinging motion of the system by the reaction force.

In these examples, however, although the swinging motion itself of the stage system can be reduced, the reaction force responsive to the stage motion is transmitted directly to the floor or to the floor via a member which can be regarded as being substantially the floor. As a result, the floor is vibrated, which then causes vibration of a peripheral apparatus adjacent to the exposure apparatus. Generally, the floor on which an exposure apparatus is disposed has a natural vibration frequency of about 20–40 Hz. If the natural frequency of the floor is excited in response to the operation of the exposure apparatus, it causes large adverse influences to peripheral equipment.

The stage acceleration is becoming larger and larger due to increases of the processing speed (throughput). For a step-and-scan type exposure apparatus, for example, the largest acceleration of a stage reaches 4G (for a reticle stage) or 1G (for a wafer stage). Further, the mass of the stage is becoming bulky, due to increases in size of a reticle or a substrate. For these reasons, a driving force that can be defined by "the mass of a moving element" as multiplied by "the acceleration" becomes very large and, therefore, the reaction force thereof is enormous. Thus, the reaction force becomes large with the increase of acceleration and weight, and vibration of the floor due to the reaction force cannot be disregarded.

Further, the size of the apparatus becomes large. In a manufacturing factory in which many production machines should be disposed, the area to be occupied by these machines is a problem to be considered.

On the other hand, the procedure for manufacturing semiconductor devices, constituted by a very fine pattern such as LSI or VLSI, uses a reduction projection exposure apparatus for projecting and printing a circuit pattern formed on a mask onto a substrate in a reduced scale. Increases in the density of a semiconductor device have required further miniaturization of the pattern, and many attempts have been made in exposure apparatuses in this respect.

The resolving power of an exposure apparatus can be improved by making the exposure wavelength shorter or by enlarging the numerical aperture (NA) of a projection optical system.

As regards the exposure wavelength, in place of i-line (365 nm), KrF excimer lasers having an emission wavelength near 248 nm and ArF excimer lasers having an emission wavelength near 193 nm, have been developed. Further, fluorine ($F_2$) excimer lasers having an emission wavelength near 157 nm are being developed.

In relation to deep ultraviolet light, more particularly, ArF excimer lasers having a wavelength near 193 nm or $F_2$ excimer lasers having a wavelength near 157 nm, it is known that there are plural oxygen ($O_2$) absorption bands in zones close to these wavelengths. As regards fluorine excimer lasers, for example, because of the short wavelength of 157 nm, the application of it to an exposure apparatus has been attempted. However, the wavelength of 157 nm is in the wavelength region generally called vacuum ultraviolet. In this wavelength region, the absorption of light by oxygen molecules is large and, therefore, the atmosphere does not transmit most of the light. For this reason, it can be applied only in an environment in which the pressure is reduced close to vacuum and the oxygen density is made sufficiently low.

Further, the absorption of light by oxygen results in production of ozone ($O_3$) which in turn functions to strengthen the absorption of light. Therefore, the transmission factor becomes very low. Additionally, various products attributable to the ozone are deposited on the surfaces of optical elements, causing a decrease of the efficiency of the optical system.

In consideration of this, along an optical path of an exposure optical system in a projection exposure apparatus having a light source of deep ultraviolet rays such as an ArF excimer laser or a fluorine excimer laser, purge means based on an inactive purge gas such as nitrogen, for example, is disposed to maintain a low oxygen concentration along the optical path, of an order of a few ppm or smaller.

As described, in an exposure apparatus using deep ultraviolet light, more particularly, an ArF excimer laser having a wavelength near 193 nm or a fluorine ($F_2$) excimer laser having a wavelength near 157 nm, since the ArF excimer laser light or $F_2$ excimer laser light can be very easily absorbed by a substance, the optical path must be purged to a few ppm order level or lower. This is also the case with water or moisture. Similarly, it must be removed to a ppm order or lower.

Thus, in order to assure a good transmission factor to ultraviolet light or a good stability of it, the path of ultraviolet light such as a reticle stage, for example, of exposure apparatuses is purged by use of an inactive gas. For example, U.S. Pat. No. 5,559,584 shows a structure in which an inactive gas is blown against a photosensitive substrate. However, in this example, purging the oxygen and water content is insufficient. Japanese Laid-Open Patent Application, Laid-Open No. 279458/1996 shows use of a closing member for covering the whole space from the bottom end of a projection optical system to a photosensitive substrate. With this structure, the motion of the stage is not easy, and it is not practicable.

SUMMARY OF THE INVENTION

It is an object of the present invention to provide an exposure apparatus by which the influence of vibration or swinging motion resulting from the motion of a stage can be reduced, and by which a high precision can be accomplished.

It is another object of the present invention to provide an exposure apparatus by which, through reduction of the influence, to the floor, of a reaction force caused in response to acceleration or deceleration of the stage, the influence which otherwise is applied to another machine or machines, disposed on the same floor, can be reduced and, also, by which the area to be occupied by the machine can be made smaller.

It is a further object of the present invention to provide an exposure apparatus which uses ultraviolet light, more particularly, ArF excimer laser light or $F_2$ excimer laser light, wherein, because the absorption of the ArF excimer laser light or $F_2$ excimer laser light by oxygen or water content is very large, the oxygen concentration or water concentration must be lowered to attain a sufficient transmission factor and a good stability of ultraviolet light. The present invention concerns development of effective purge means in relation to a wafer and/or a reticle, which moves along the path of ultraviolet light inside the exposure apparatus.

On the basis of these features, the present invention can provide a device manufacturing method of a good productivity, using an exposure apparatus such as described above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

[Embodiment 1]

Figure 1A:
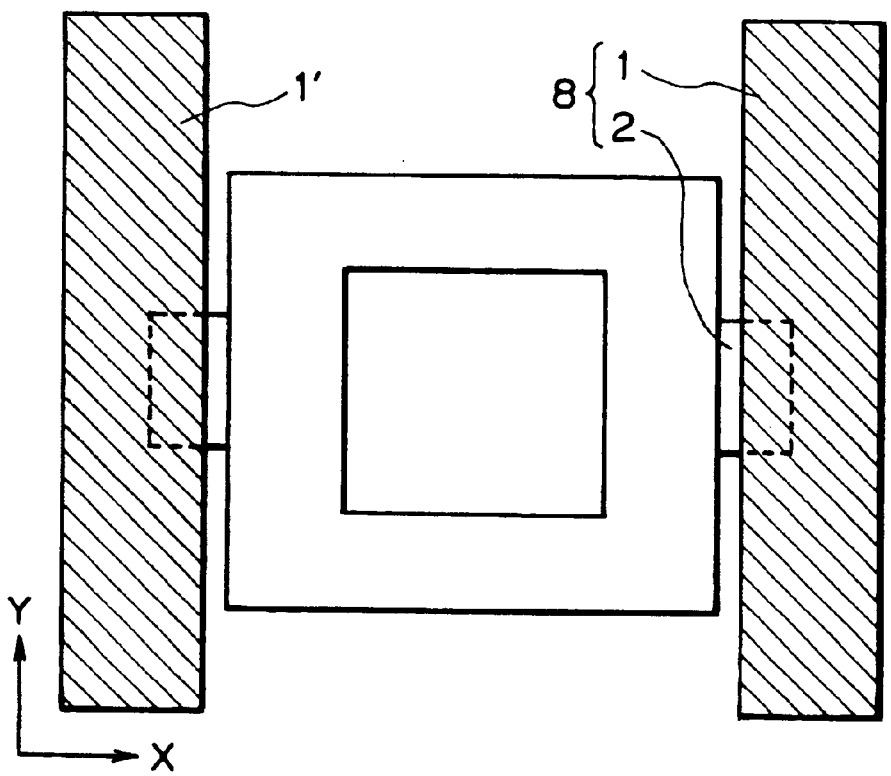
FIGS. 1A and 1B are schematic views, respectively, of a moving system according to an embodiment of the present invention.
Figure 1B:
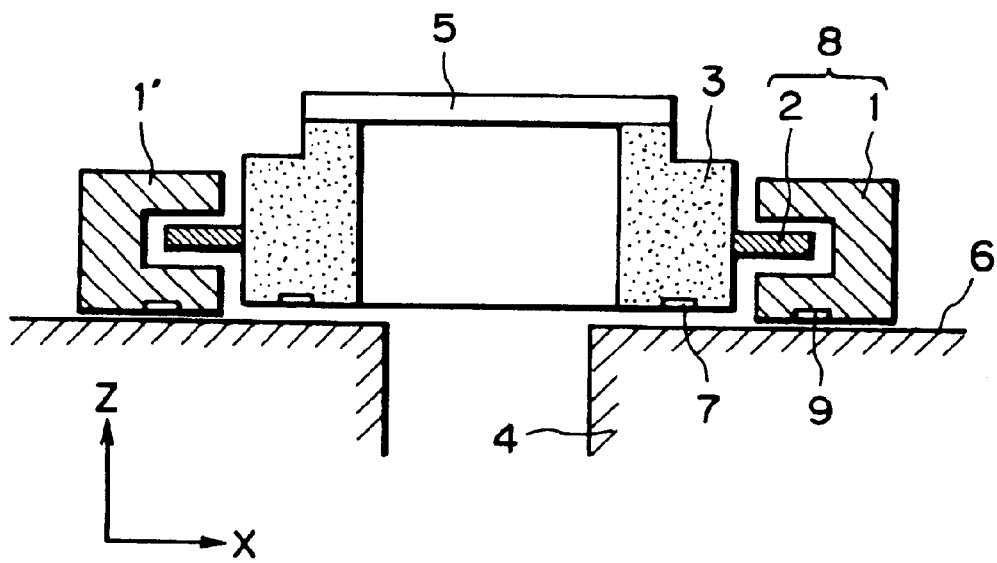

FIG. 1A is a plan view of a moving system according to an embodiment of the present invention, and FIG. 1B is a sectional view of the same.

In FIGS. 1A and 1B, a reference structure 4 is formed with a plane guide surface 6 which provides a reference. A movable member 3 is supported by a static bearing 7, without contact to the plane guide surface 6, and it is movable in a Y direction. Mounted on the opposite sides of the movable element 3 are electromagnetic actuators 8 for moving the movable element 3 in the Y direction. Each electromagnetic actuator 8 comprises a movable element 2 as well as stators 1 and 1' which are separated and independent from each other with respect to a lateral direction. Here, the left-hand and right-hand stators 1 and 1' are supported by a static bearing 9 without contact to the plane guide surface 6, and they are movable in the Y direction. Also, the stators 1 and 1' have a predetermined weight, and they have a function as a reaction force counter, to be described later. The movable element 2 is connected to a moving unit 3 which can be moved by the movable element 2 in parallel to the plane guide surface. The moving unit 3 may be provided with a top plate 5, for example, so that an article to be moved can be placed there. The moving unit 3 as a whole, including the movable element 2, constitutes a moving structure which can be moved in the Y direction by means of the electromagnetic actuators 8 having movable elements 2 and stators 1 and 1'.

The left-hand and right-hand stators 1 and 1' receive a drive reaction force of the force which functions to move the moving unit 3 as a whole, including the movable element 2. With this drive reaction force, the stators 1 and 1' displace along the plane guide surface 6. Through this motion of the stators 1 and 1' along the plane guide surface 6, the stators 1 and 1' can function as a reaction force counter. In this embodiment, if, for example, the moving unit 3 as a whole moves in the positive (+) Y direction, the stators 1 and 1' receive a drive reaction force in the negative (−) Y direction and thus they shift in the negative Y direction.

In this embodiment, each electromagnetic actuator comprises a right-hand linear motor which includes a moving element 2 and a stator 1, and a left-hand linear motor which includes a moving element 2 and a stator 1'. The left-hand and right-hand linear motors have a stator provided by a coil, and a moving element provided by a permanent magnet.

However, the structure may be reversed. In order to control the moving system, one or more interferometers (not shown) may be provided to perform the positioning of the moving element 2 and the reference structure 4. Similarly, in order to accomplish the positioning of a reaction force counter, moving along a plane, the position of the stator may be measured by using an interferometer, not shown.

In this embodiment, the reaction force during acceleration or deceleration as the moving unit 3 as a whole of the moving system moves is received by the stators 1 and 1', as a reaction force counter. Through the motion of these stators 1 and 1' (reaction force counter), the reaction force is converted into a kinetic energy. Also, since the action force and the reaction force thereof are confined within the plane of the plane guide surface 6 provided on the reference structure 4, vibration of the machine reference structure 4 by the reaction force can be prevented. Additionally, external disturbance to the floor on which the machine is placed can be avoided, such that production of vibration inside and outside the machine can be prevented. Moreover, since the independent stators 1 and 1' (reaction force counter) move along the machine reference structure 4 in accordance with the acceleration of the moving unit 3 as a whole (moving member), any eccentric or biased load as the moving member moves can be made small, and thus the overlay precision is improved. Namely, in accordance with this embodiment, since the stators 1 and 1' move in a direction opposite to the direction in which the moving member moves, any displacement of the position of the gravity center of the whole structure, including the moving member and the stators, can be suppressed, such that the biased load as the moving member moves can be made small.

Further, in accordance with this embodiment, the left-hand and right-hand stators 1 and 1' are provided independently from each other. As a result, even if the left-hand and right-hand electromagnetic actuators produce different outputs, these stators are moved separately to cancel the reaction force. The left-hand and right-hand actuators may produce such different outputs, for example, in a case where the moving member should be rotationally moved in a θ direction, or a case where an article placed on the moving member has a biased load with respect to the X direction, for example.

Although this embodiment has been described with reference to an example wherein the electromagnetic actuator moves the moving member in the Y direction, the present invention is not limited to this. For example, the moving member may be moved in the X and Y directions. On that occasion, the electromagnetic actuator may preferably comprise a mechanism for producing a driving force in the X and Y directions and applying the same to the moving member. Also, on that occasion, the stators 1 and 1' may be supported by the static bearing 9 with respect to the plane guide surface 6, and movably in the X and Y directions.

[Embodiment 2]

Figure 2:
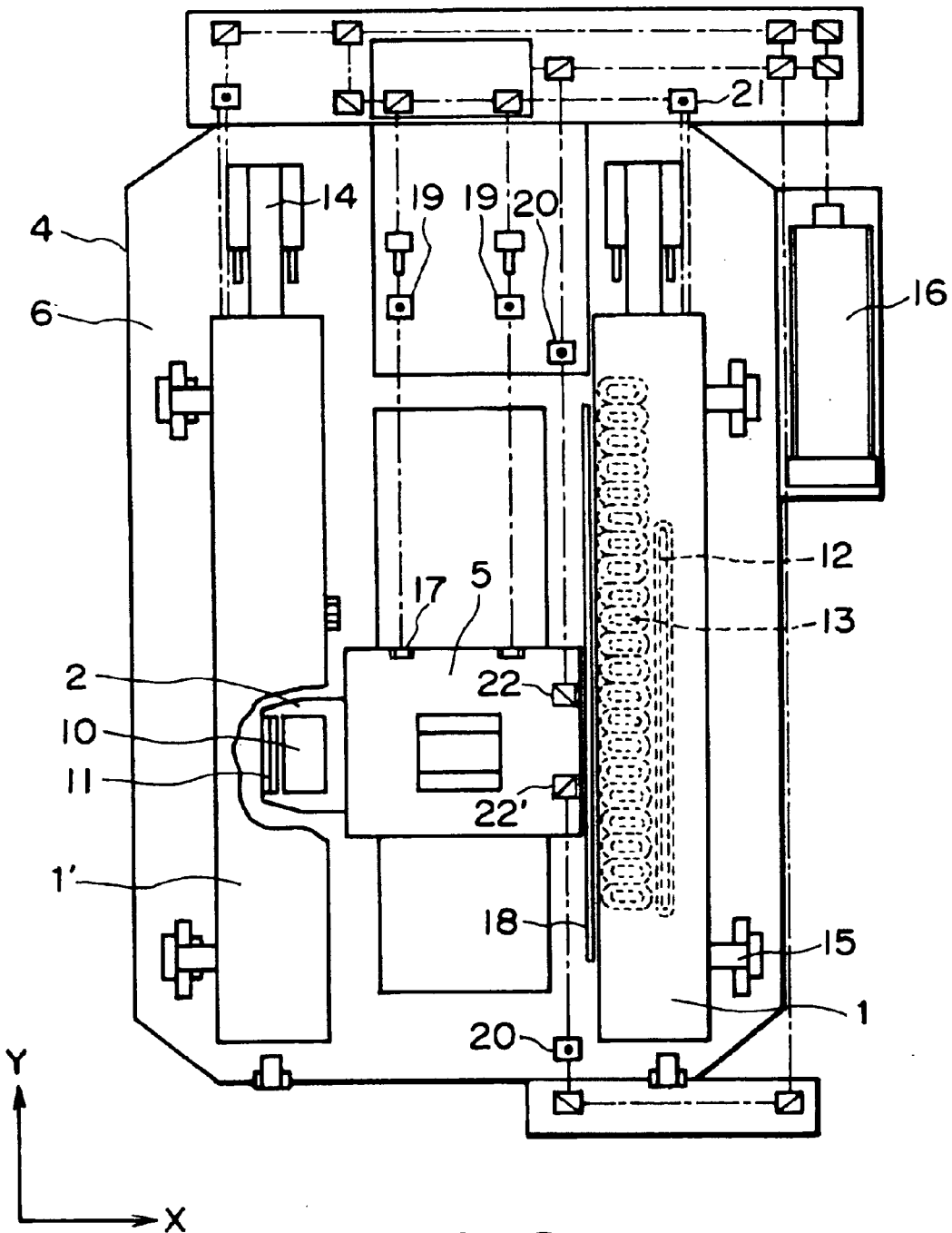
FIG. 2 is a schematic view of a stage according to an embodiment of the present invention.

FIG. 2 shows an embodiment in which a stage according to the present invention is provided with position measuring means and driving means, for positioning a movable portion thereof.

Like the first embodiment, a reference structure 4 has a plane guide surface 6 formed thereon to provide a reference. A movable element (not shown) is supported by a static bearing, without contact to the plane guide surface 6, and it is made movable in X and Y directions. Mounted on the opposite sides of the movable element 3 are electromagnetic actuators for moving the movable element 3 through a long stroke in the Y direction, and through a short stroke in the X direction. Each electromagnetic actuator comprises a movable element 2 as well as stators 1 and 1' which are separated and independent from each other with respect to a lateral direction. Here, the left-hand and right-hand stators 1 and 1' are supported by a static bearing 9 without contact to the plane guide surface 6, and they are movable in X and Y directions (along a plane). Also, the stators 1 and 1' have a predetermined weight, and they have a function as a reaction force counter, to be described later. The left-hand and right-hand movable elements 2 have two, left-hand and right-hand movable portion Y magnets 10 and two, left-hand and right-hand movable portion X magnets 11, attached to them. Also, there is a top plate 5 mounted on a movable portion, the whole of which is not shown in the drawing. The top plate 5 functions as an X-Y stage, and it is moved by the moving elements 2 in a direction parallel to the plane guide surface 6. Inside each stator 1 or 1', there are an X-axis linear motor single-phase coil 12 and a Y-axis linear motor multi-phase coil 13 comprising plural coils arrayed in the Y direction. By changing these coils, X-axis and Y-axis motion is carried out.

The positional information about the top plate 5 (X-Y stage) is measured by a laser interferometer which comprises a laser head 16, a Y-axis measurement mirror 17, an X-axis measurement bar mirror 18, two, left-hand and right-hand Y-axis measurement detectors 19, and two, front and rear X-axis measurement detectors 20, for example. The Y-axis position of the stators 1 and 1' is measured by means of two, left-hand and right-hand stator Y-axis measurement detectors 21. Further, the X-axis position of the top plate 5 is measured by projecting laser light to optical elements 22 and 22' mounted on the top plate 5, in the Y direction. This measurement light is reflected or deflected in the X-axis direction toward the X-axis measurement bar mirror 18, whereby the position is measured by means of the X-axis measurement detectors 20.

The X-Y stage of this embodiment can be used as a reticle stage or a wafer stage in an exposure apparatus, and an original (reticle) or a substrate (wafer) can be placed on the top plate 5 (X-Y stage) of the moving unit.

The moving unit having an original (reticle) or a substrate (wafer) placed on its top plate 5 is moved by electromagnetic actuators, having moving elements and stators 1 and 1', in the X and Y directions. The stators 1 and 1' receive a drive reaction force of the force acting on the motion of the moving unit as a whole. With this drive reaction force, the stators 1 and 1' move along the plane guide surface. Through the motion of the stators 1 and 1' along the plane guide surface 6, the stators 1 and 1' function as a reaction force counter. In this embodiment, if, for example, the moving unit as a whole moves in the positive (+) Y direction, the stators 1 and 1' receive a drive reaction force in the negative (−) direction, and they move in the negative Y direction. The effect of the reaction force counter is substantially the same as that of the preceding embodiment.

In this embodiment, there are two Y-axis position controlling linear motors 14 provided on the reference structure 4, which serve to push back the stators 1 and 1' having moved in the Y-axis direction by an amount greater than a predetermined distance. Also, there are four X-axis position controlling linear motors 15 provided on the reference structure 4, which serve to push back the stators 1 and 1' having moved in the X-axis direction by an amount greater than a predetermined distance. With this arrangement, if the movable portion moves by an amount greater than a predetermined, the stators 1 and 1' are moved similarly by an amount larger than a predetermined. However, by means of the Y-axis position controlling linear motors 14 and the X-axis position controlling linear motors 15, the stators 1 and 1' can be controlled and placed at the predetermined position. Further, even if there occurs a deviation in the stator position due to the influence of friction or resistance, for example, by using the Y-axis position controlling linear motors and/or the X-axis position controlling linear motors, and without using a drive of the electromagnetic actuators, the stator position can be corrected.

The exposure apparatus of this embodiment can be applied as a step-and-scan type scanning exposure apparatus in which an exposure is carried out while scanningly moving a reticle and a wafer in synchronism with each other so that a reticle pattern is printed and transferred onto one shot region on the wafer and, by moving the wafer stepwise, patterns are transferred to plural shot regions sequentially. However, the present invention is not limited to a step-and-scan type exposure apparatus. It is effective also to a step-and-repeat type exposure apparatus in which the wafer stage is moved stepwise, at a high speed.

In accordance with this embodiment, the reaction force during acceleration or deceleration as the X-Y stage moves is received by the stators, such that, through the motion of these stators in the direction opposite to the X-Y stage, the reaction force is converted into a kinetic energy. As a result, vibration of the X-Y stage system can be prevented, and the overlay precision, the linewidth precision and the throughput in the exposure process can be improved. Further, since the two stators (reaction force counters) move along the machine reference structure in accordance with the acceleration of the X-Y stage, the biased load as the X-Y stage moves can be made small, and the overlay precision can be improved.

[Embodiment 3]

Figure 3:
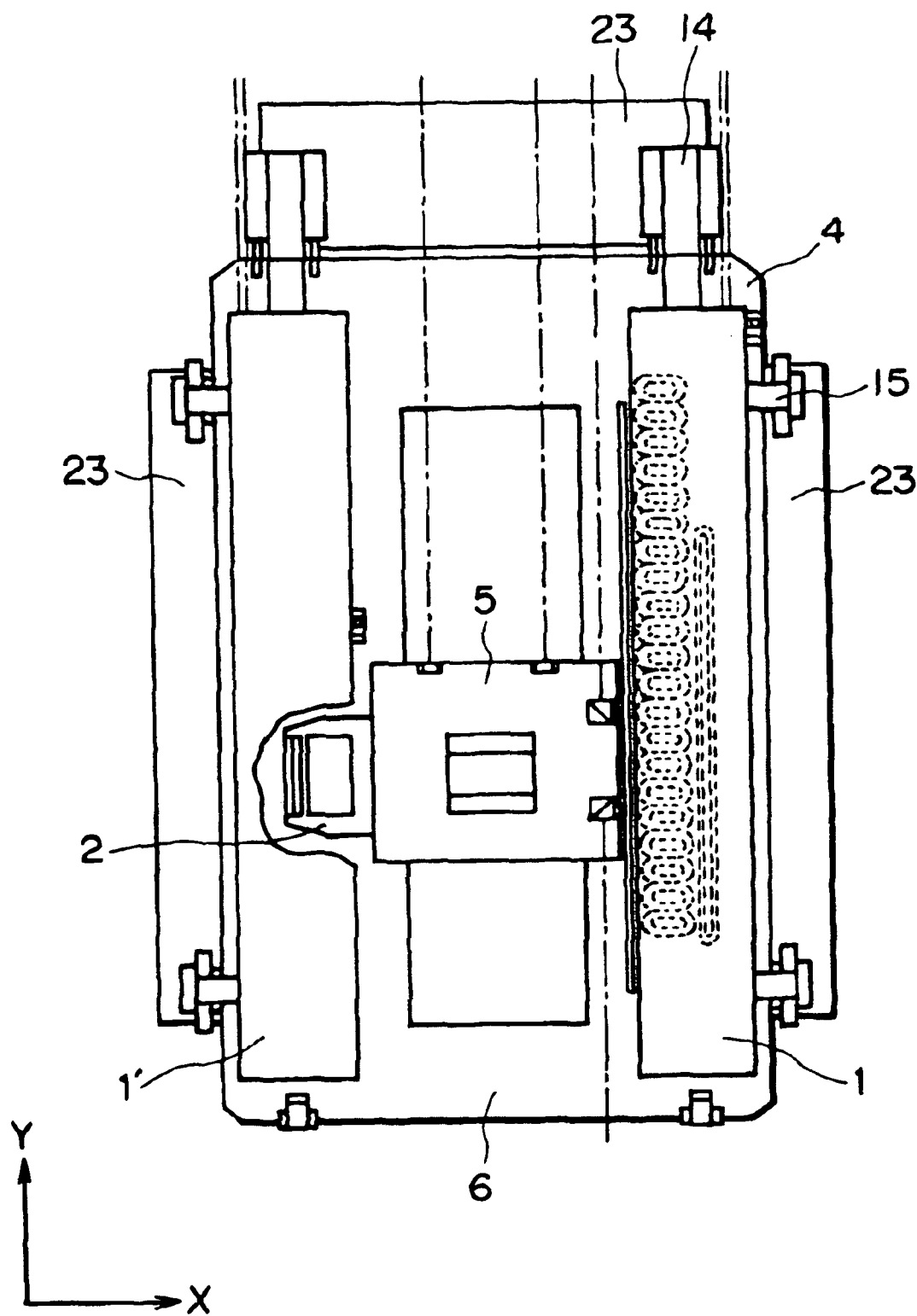
FIG. 3 is a schematic view of a stage according to another embodiment of the present invention.

FIG. 3 shows an embodiment in which an X-Y stage according to the present invention has a stator position controlling actuator which is mounted on an external structure separate from the reference structure, rather than being mounted on the reference structure as in the second embodiment.

In FIG. 3, those portions common to FIG. 2 are illustrated without reference numerals. Like the first embodiment, a reference structure 4 has a plane guide surface 6 formed thereon to provide a reference. A movable element (not shown) is supported by a static bearing, without contact to the plane guide surface 6, and it is made movable in X and Y directions. Mounted on the opposite sides of the movable element are electromagnetic actuators for moving the movable element through a long stroke in the Y direction, and through a short stroke in the X direction. Each electromagnetic actuator comprises a movable element 2 as well as stators 1 and 1' which are separated and independent from each other with respect to a lateral direction. Here, the left-hand and right-hand stators 1 and 1' are supported by a static bearing without contact to the plane guide surface 6, and they are movable in X and Y directions (along a plane). Also, the stators 1 and 1' have a predetermined weight, and they have a function as a reaction force counter, to be described later. The left-hand and right-hand movable elements 2 have two, left-hand and right-hand movable portion Y magnets 10 and two, left-hand and right-hand movable portion X magnets 11, attached to them. Also, there is a top plate 5 mounted on a movable portion, the whole of which is not shown in the drawing. The top plate 5 functions as an X-Y stage, and it is moved by the moving elements 2 in a direction parallel to the plane guide surface 6. Inside each stator 1 or 1', there are an X-axis linear motor single-phase coil 12 and a Y-axis linear motor multi-phase coil 13 comprising plural coils arrayed in the Y direction. By changing these coils, X-axis and Y-axis motion is carried out.

The positional information about the top plate 5 (X-Y stage) is measured by a laser interferometer which comprises a laser head, a Y-axis measurement mirror, an X-axis measurement bar mirror, two, left-hand and right-hand Y-axis measurement detectors, and two, front and rear X-axis measurement detectors, for example. The Y-axis position of the stators 1 and 1' is measured by means of two, left-hand and right-hand stator Y-axis measurement detectors. Further, the X-axis position of the top plate 5 is measured by projecting laser light to optical elements mounted on the top plate 5, in the Y direction. This measurement light is reflected or deflected in the X-axis direction toward the X-axis measurement bar mirror, whereby the position is measured by means of the X-axis measurement detectors.

In this embodiment, for the stators 1 and 1', two Y-axis position controlling linear motors 14 are provided on an external structure 23, and they function to push back the stators 1 and 1' as they move in the Y-axis direction by an amount larger than a predetermined amount. Similarly, for the stators 1 and 1', there are four X-axis position controlling linear motors 15 which are mounted on the external structure 23, to push back the stators 1 and 1' as they move in the X-axis direction by an amount greater than a predetermined amount.

The external structure 23 is isolated from the reference structure 4 with respect to vibration. As a result, when the X-Y stage is moved by an amount greater than a predetermined and thus the Y-axis position controlling linear motors 14 and the X-axis position controlling linear motors 15 are driven to bring the stators 1 and 1' to their predetermined positions, the drive reaction force resulting therefrom is not transmitted to the reference structure 4 and thus precise positioning of the movable portion on the reference structure can be accomplished. Particularly, where it is necessary to move the stators 1 and 1' back to their predetermined positions quickly, even if the control band of the position controlling linear motor is raised, the drive reaction force of the position controlling linear motor is not transmitted to the reference structure 14.

[Embodiment 4]

Figure 4A:
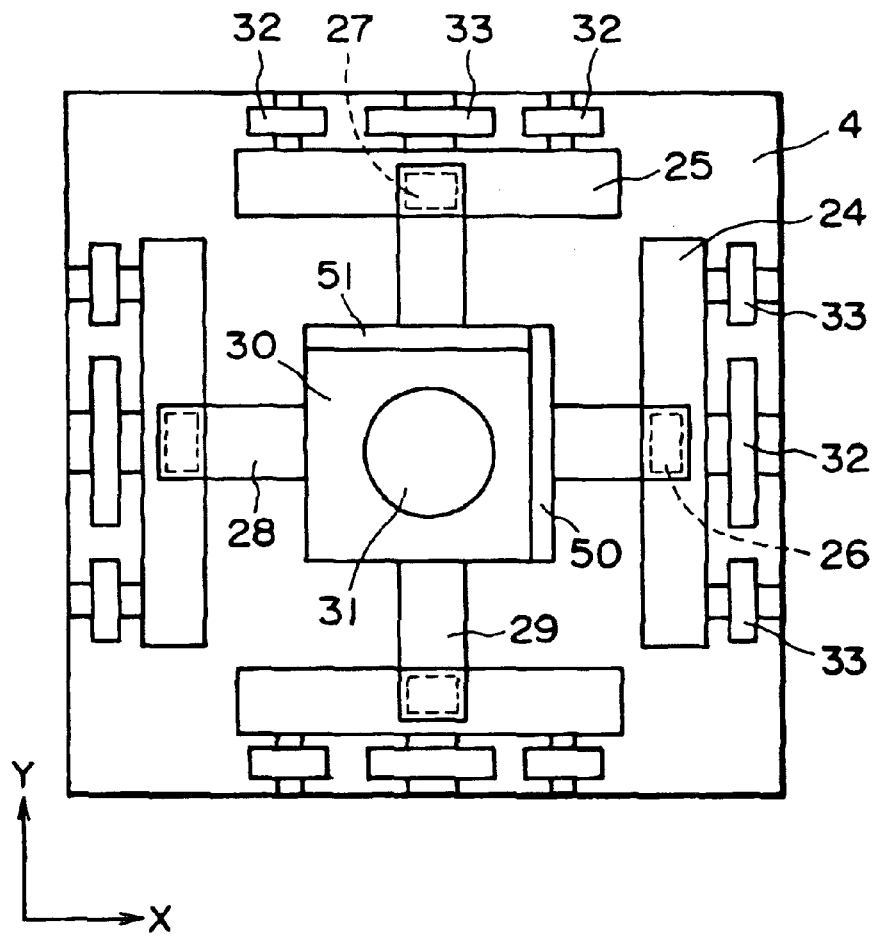
FIGS. 4A and 4B are schematic views, respectively, of an embodiment in which a stage according to the present invention is incorporated into an exposure apparatus.
Figure 4B:
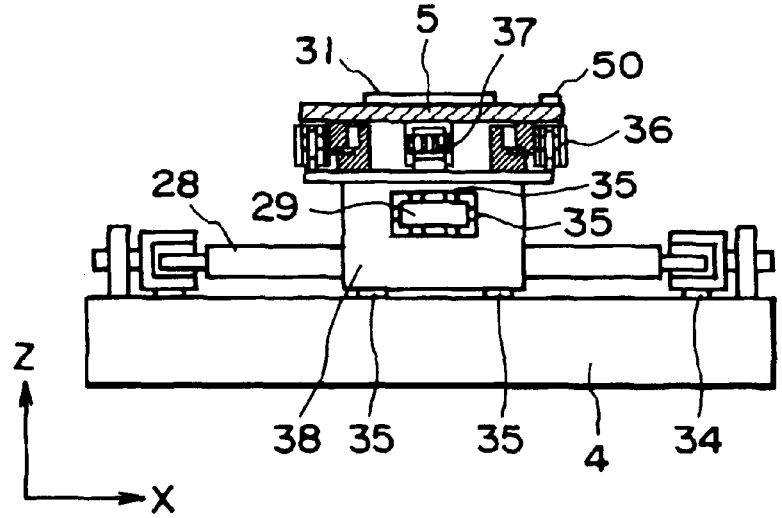

FIGS. 4A and 4B show an embodiment in which an exposure apparatus according to the present invention is applied to a fine-motion stage (six-axis motion stage) on which a 9 and Z-axis tilt stage is mounted.

In FIGS. 4A and 4B, a top plate 5 is provided with a wafer chuck 30 and a position measuring bar 50. The wafer chuck 30 serves to vacuum attract a wafer (the subject to be positioned) and hold the same. Bar mirrors 50 and 51 reflect measurement light from a laser interferometer, not shown. The top plate 5 is floated from and X-Y slider 38, by means of a self-weight compensator (not shown) using a magnet, without contact to the slider, and it has a freedom with respect to six-axis directions. Further, the top plate 5 can be minutely driven in six-axis directions (X, Y, and Z directions as well as rotational directions about them), by means of an actuator for producing a driving force between the top plate 5 and the X-Y slider 38. The six-axis fine motion actuator comprises two linear motors in the X direction, one linear motor in the Y direction, and three linear motors in the Z direction. When the two X-direction fine motion linear motors are driven in opposite directions, the top plate can be moved about the Z-axis (i.e., in the θ direction). Thus, by adjusting the driving forces of the three Z-direction fine motion linear motors, the top plate can be moved about the X-axis (wX direction) and about the Y-axis (wY axis direction), respectively. Further, the coil which serves as a stator of the fine-motion linear motor is provided at the X-Y slider 38 side, while the permanent magnet which serves as a movable element of the fine-motion linear motor is provided at the top plate side.

The X-Y slider 38 top plate is mounted on the X-Y slider 38 being movable along the X-Y plane through a long stroke. The X-Y slider 38 is guided by an air bearing (static pressure bearing) 35 along an X guide bar 28 and a Y guide bar 29. On the other hand, the X-Y slider 38 is guided with respect to the Z direction, by means of an air bearing (static pressure bearing 35, along the top surface of the reference structure 4.

Adjacent to the opposite ends of the X-guide bar 28 and the Y guide bar 29, there are movable elements (magnets) 26 and 27 of the linear motors. In response to the flow of electric current to the two X and Y linear motor stators (coils), a Lorentz force is produced, such that the X guide bar 28 can be moved in the Y direction while the Y guide bar 29 can be moved in the X direction. The linear motor stators (coils) 24 and 25 are guided along the top surface of the reference structure 4, by means of an air bearing (static pressure bearing), with respect to the Z direction, and they have a freedom with respect to the X and Y directions (along a plane).

Now, the motion of the X-Y slider 38 in the X direction will be explained. When the Y guide bar is moved in the X direction by the Lorentz force described above, a force in the X direction is applied to the X-Y slider 38 through the static bearing 35. Here, the X-Y slider and the Y guide bar will be called an X movable unit. When the X movable unit is accelerated or decelerated, a reaction force thereof is applied to the X linear motor stator 25. Since the X linear motor stator 25 is supported by the static bearing 34, movably in the X and Y directions, due to this reaction force, the X linear motor stator 25 moves in the X direction. The acceleration and speed of the motion is determined by the ratio between the mass of the X linear motor stator 25 and the mass of the X movable unit. For example, if the mass of the X linear motor stator 25 is 200 Kg per each while the mass of the X movable unit is 40 Kg, the ratio of the mass is 10:1. Therefore, both the acceleration and speed of the X linear motor 21 is one-tenth ($\frac{1}{10}$) of the X movable unit. In this manner, through the motion of the X linear motor stator 25 in the X direction, in the reference structure, no X-direction reaction force is applied to the X linear motor stator 25.

Further, by setting the gravity center of the X movable unit and the point of producing the force of the X linear motor, with respect to the Z direction, at the same level, production of a moment force in the wY direction can be suppressed. Therefore, the application of a drive reaction force to the reference structure 4 can be avoided. Similarly, by setting the point of producing a force of the X linear motor stator 22 and the gravity center of the X-linear motor stator 25, with respect to the Z direction, at the same level, production of a moment force in the wY direction can be prevented.

The X-linear motor stator 25 is provided with at least two linear motors 33 for controlling the position of the linear motor stator, with respect to the X direction, as well as at least one linear motor 33 for controlling the position of the linear motor stator with respect to the Y direction, both for maintaining the relative position with respect to the reference structure 4. These linear motors 33 for controlling the position of the linear motor stator function to prevent that, even if the X movable unit is moved beyond a predetermined range, the linear motor stator goes out of a predetermined movement range. Further, even if there occurs a positional deviation due to friction or resistance as the linear motor stator 25 moves, it can be corrected.

While the foregoing description concerns the X direction, the same applies to the Y direction.

In this embodiment, since the X-Y slider is movable in the X and Y directions, the driving force to be produced by the linear motor is different in accordance with the position of the X-Y slider. For example, if in FIG. 4A the X-Y slider 38 moves in the positive (+) Y direction and thereafter it moves in the positive (+) X direction, since the X-Y slider as it moves in the positive X direction is on the side close to the positive Y direction, only the driving force as produced by the upper X linear motor, as viewed in the drawing, is larger than the driving force of the lower X linear motor, as viewed in the drawing. This is because, if on such an occasion the outputs of these X linear motors are the same, a moment in the θ direction will be applied to the X-Y slider 38. If the stators are connected to each other into an integral structure, depending on the position of the X-Y slider, a moment in the θ direction may be applied when the drive reaction force is being canceled. In this embodiment, even if the driving forces of the linear motors are different, since the linear motor stators are supported independently from the reference structure, while being movable in the X and Y directions, each stator can function to cancel the drive reaction force, independently of each other.

[Embodiment 5]

Figure 5:
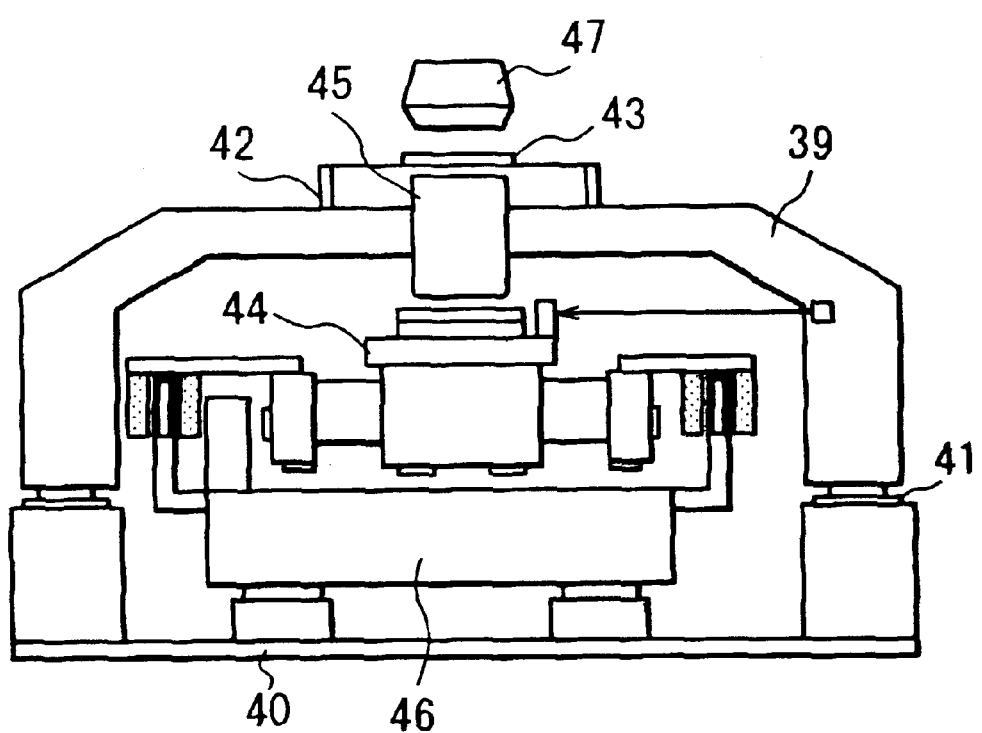
FIG. 5 is a schematic view of an embodiment in which a stage according to the present invention is incorporated into an exposure apparatus.

Referring to FIG. 5, an embodiment of a scan type exposure apparatus in which a stage system according to the preceding embodiment is incorporated as a wafer stage, will be explained.

A barrel base 39 is supported by a floor or a base structure 40, through a damper 41. Also, the barrel base 39 functions to support a reticle base table 42 and to support a projection optical system 45 disposed between a reticle stage 43 and a wafer stage 44.

The wafer stage is supported by a stage base table 46 which is supported by the floor or the base structure, and it functions to perform the positioning of a wafer placed thereupon. On the other hand, the reticle stage is supported by a reticle stage base table which is supported by the barrel base. The reticle stage is movable while carrying thereon a reticle having a circuit pattern formed thereon. The exposure light for printing the reticle placed on the reticle stage 43 upon the wafer being placed on the wafer stage 44, is supplied by an illumination optical system 47.

The wafer stage 44 is scanningly moved in synchronism with the reticle stage 43. During the scan of the reticle stage 43 and the wafer stage 44, the positions of them are detected continuously by using respective interferometers, and the detected positions are fed back to the driving unit of the reticle stage 43 and the wafer stage 44. With this arrangement, the scan start position of these stages can be synchronized with each other, and also the scan speed in a constant-speed scan region can be controlled very precisely. During a period in which the reticle and the wafer are scanned relative to the projection optical system, the reticle pattern is printed on the wafer by which a circuit pattern is transferred to it.

The exposure light may be ultraviolet light such as from a fluorine excimer laser, an ArF excimer laser and a KrF excimer laser, for example.

In this embodiment, since a stage system with which the influence of a reaction force, to the floor, due to the acceleration and deceleration of the stage, in the preceding embodiment, is reduced is used as a wafer stage, vibration or swinging motion can be reduced, and thus high speed and high precision exposure is accomplished.

[Embodiment 6]

Figure 6A:
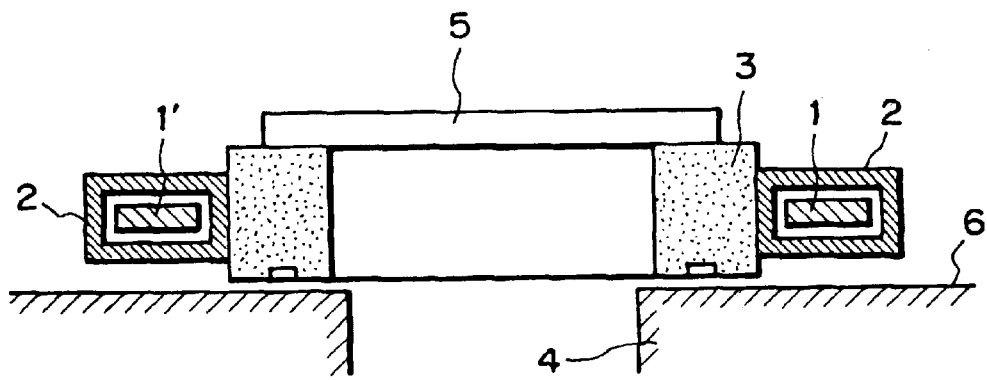
FIGS. 6A and 6B illustrate the relationship between a stator and a moving element.
Figure 6B:
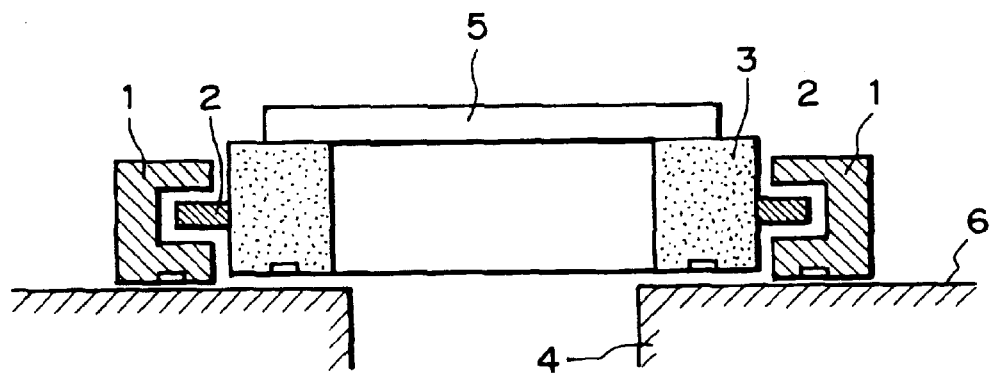

When the electromagnetic actuator comprises a linear motor having a movable element and a stator, the movable element and the stator may have a telescopic structure such as shown in FIG. 6A or an open structure such as shown in FIG. 6B. In FIGS. 6A and 6B, there are electromagnetic actuators each having a movable element 2 and left-hand and right-hand stators 1 and 1', being separated and independent from each other. Here, the left-hand and right-hand stators 1 and 1' function also as a reaction force counter having a predetermined weight. They are movable along the plane guide surface 6 on the reference structure 4. In the case of a telescopic structure such as shown in FIG. 6A, the stators 1 and 1' are supported at the opposite ends of the straight direction. At the opposite ends, they can move freely along the plane guide surface 6 of the straight direction. At the opposite ends, they can move freely along the plane guide surface 6 of the reference structure 4. The movable element 2 is connected to a moving unit 3 being movable in parallel to the plane guide surface by the moving element 2. A top plate 5, for example, may be provided on the movable unit 3, so that an article to be moved can be placed there. On the other hand, when an open structure such as shown in FIG. 6B is used, the structure and function will be the same as has been described with reference to the first embodiment.

Ordinary moving systems, X-Y stages and exposure apparatuses may use any one of the telescopic structure and the open structure. However, as described, in an exposure apparatus using ultraviolet light as the exposure light, oxygen and water content along the path of ultraviolet light must be purged completely.

Figure 7A:
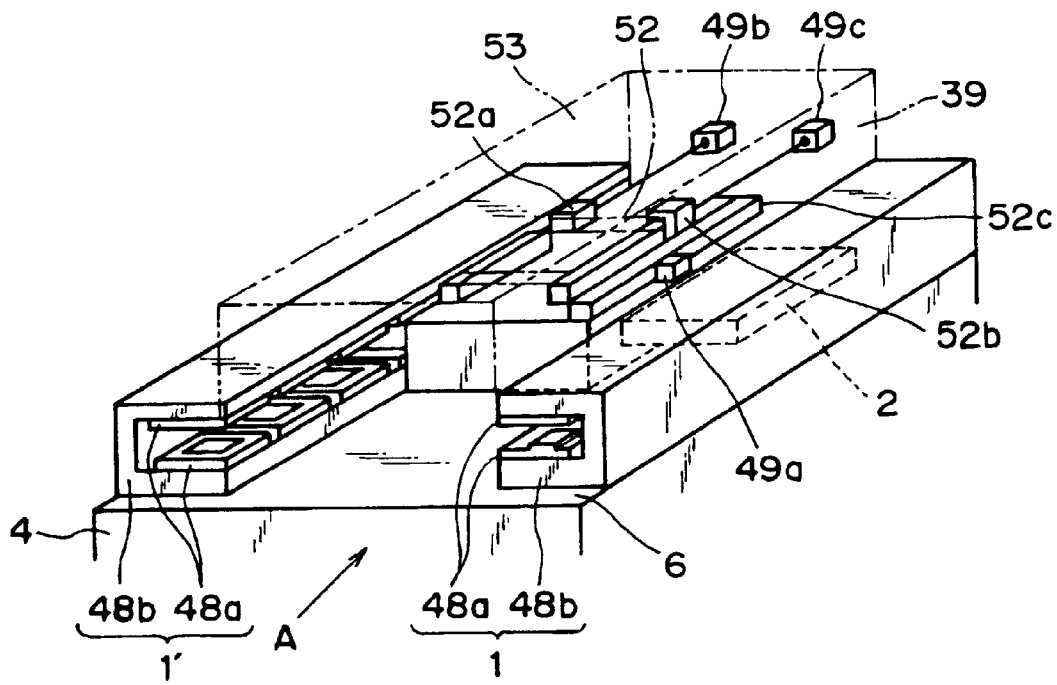
FIGS. 7A and 7B are schematic views, respectively, showing a portion close to a reticle stage, in an exposure apparatus according to an embodiment of the present invention.
Figure 7B:
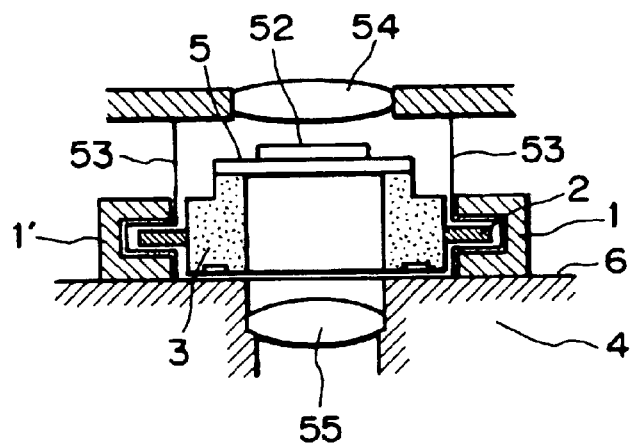

FIGS. 7A and 7B show an exposure apparatus according to an embodiment of the present invention, in which the relationship between a stator and a movable element of a linear motor in an X-Y stage is based on an open structure, to a telescopic structure. There is a shielding wall provided inside the stator, and it extends from an illumination optical system to an end face of a substrate structure which serves also as a projection optical system, including a movable unit on which a reticle is placed. The inside space of this wall is purged by using an inactive gas.

FIG. 7A is a perspective view about an X-Y stage on which a reticle is placed, and FIG. 7B is a section as viewed from a direction A in FIG. 7A.

In FIG. 7A, there are electromagnetic actuators mounted on a reference structure 4 having a plane guide surface 6. Each electromagnetic actuator comprises a movable element 2 (permanent magnet) and left-hand and right-hand stators 1 and 1'. The stators 1 and 1' are separated and independent from each other, and each has coils 48a and a yoke 48b. The stators 1 and 1' function also as a reaction force counter having a predetermined weight. They can be moved freely along the plane guide surface 6 of the reference structure 4. Mounted on a movable unit 3 having left-hand and right-hand movable elements 3 is a top plate 5. This top plate 5 functions as an X-Y stage. A reticle 52 is placed on the top plate 5, and it can be moved by the movable elements 2, in parallel to the plane guide surface 6. Mounted on the top plate 5 are a mirror of an interferometer, or bar mirrors 52a, 52b and 52c. These components cooperate with detectors 49a, 49b and 49c as well as a laser head (not shown), or the like, to provide an interferometer.

As shown in FIG. 7B, there is a shielding wall 53 for covering the movable element 2, the movable element 3, the top plate 5, the reticle 52 as well as the mirrors, bar mirrors and detectors which constitute an interferometer. The shielding wall 53 extends from the illumination optical system 54 to an end face of a substrate structure, which functions also as the projection optical system 55. Particularly, the stators 1 and 1' have an open structure, not a telescopic structure. The inside space of the shielding wall is purged by an inactive gas, against impurities.

In this manner, the relation between the stator and the movable element of the linear motor for the stage is based on an open type structure, and a shielding wall is provided between the stator and the movable element. Also, the inside space is purged against impurities, by using an inactive gas. As a result, even if fluorine laser light is used, the transmission factor is not attenuated by oxygen or water, and a good stability of it is assured. Further, the purge space around a reticle can be made compact, and the replacing time of inactive gas can be made short. Moreover, because the stator is outside the purge space, it is not influenced by degassing from the stator.

While this embodiment has been described with reference to a one-axis drive reticle stage, the reticle stage may be made movable in the X-axis direction about a movable element, thereby to provide an X-Y stage. Further, a θ-Z tilt stage may be mounted to provide a six-axis movable wafer stage.

[Embodiment of Semiconductor Manufacturing System]

Next, an embodiment of a manufacturing system for manufacturing semiconductor devices such as semiconductor chips (e.g., IC or LSI), liquid crystal panels, CCDs, thin film magnetic heads, or micro-machines, for example, will be described. This system is arranged so that repair of any disorder occurring in a production machine placed in a semiconductor manufacturing factory or periodic maintenance thereof or, alternatively, maintenance services such as software supply, can be made by use of a computer network outside the manufacturing factory.

Figure 8:
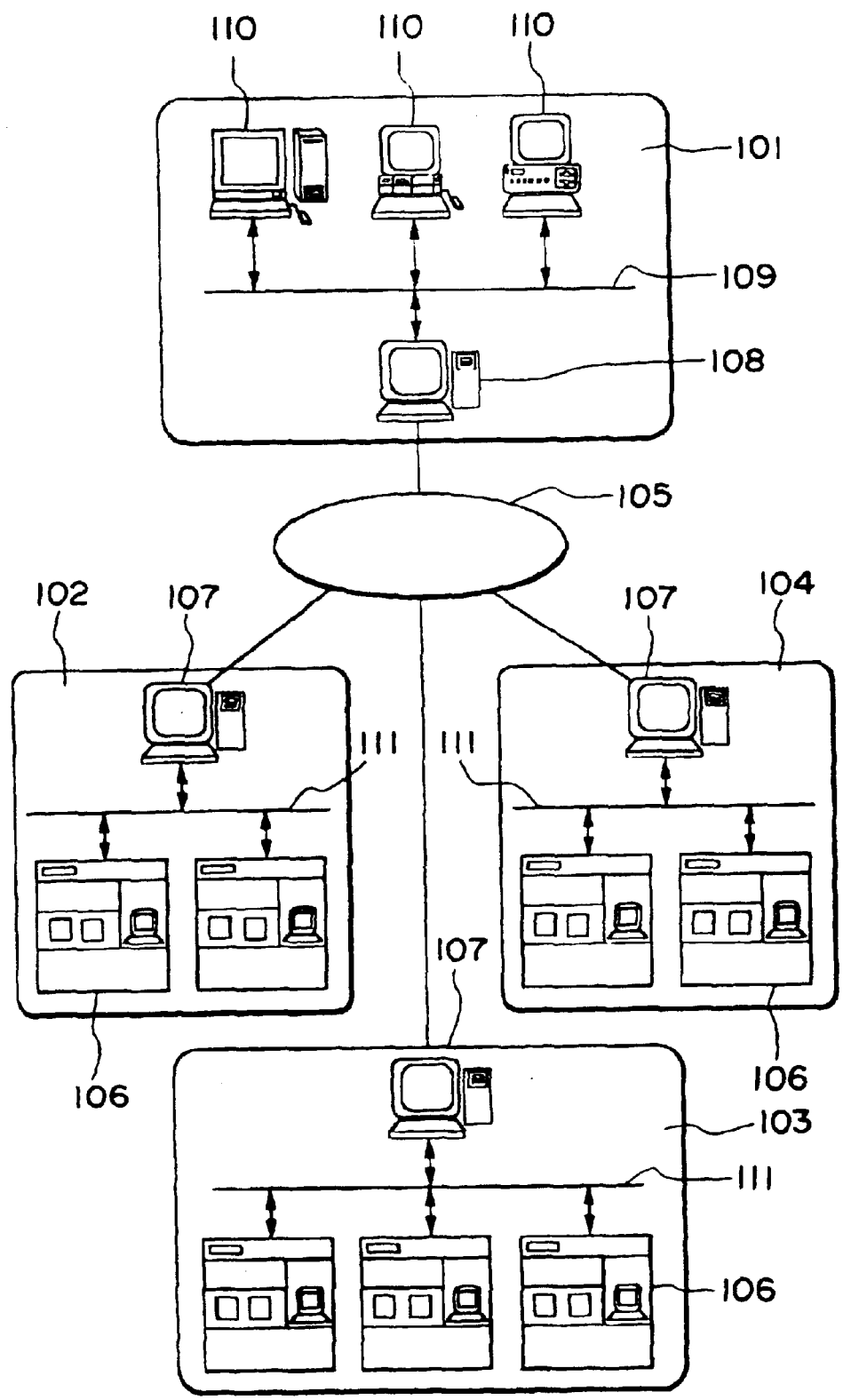
FIG. 8 is a schematic view of a semiconductor device manufacturing system, as viewed in a certain aspect thereof.

FIG. 8 is a schematic view of a general structure of the production system, in a certain aspect thereof. Denoted in the drawing at 101 is a business office of a vendor (machine supplying maker) for providing semiconductor device manufacturing apparatuses. As examples of such production machines, here, pre-process machines (various lithographic apparatuses such as an exposure apparatus, a resist coating apparatus, an etching apparatus, for example, as well as a heat treatment apparatus, a film forming apparatus, and a flattening apparatus) and post-process machines (an assembling machine and an inspection machine, for example) are assumed. Inside the business office 101, there are a host control system 108 for providing a maintenance database for the production machines, plural operating terminal computers 110, and a local area network (LAN) 109 for connecting them to constitute an intranet. The host control system 108 is provided with a gateway for connecting the LAN 109 to an internet 105 which is an outside network of the office, and a security function for restricting the access from the outside.

On the other hand, denoted at 102–104 are plural manufacturing factories of a semiconductor manufacturer or manufacturers as a user (users) of production machines. The factories 102–104 may be those which belong to different manufacturers or to the same manufacturer (e.g., they may be a pre-process factory and a post-process factory). In each of the factories 102–104, there are production machines 106, a local area network (LAN) 111 for connecting them to constitute an intranet, and a host control system 107 as a monitoring system for monitoring the state of operation of the production machines 106. The host control system 107 in each factory 102–104 is provided with a gateway for connecting the LAN 111 in the factory to the internet 105 which is an outside network of the factory. With this structure, the host control system 108 of the vendor 101 can be accessed from the LAN 111 in each factory, through the internet 105. Further, due to the security function of the host control system 108, only admitted users can gain access thereto. More specifically, through the internet 105, status information representing the state of operation of the production machines 106 (for example, the state of the machine in which any disorder has occurred) may be transmitted as a notice from the factory to the vendor. Additionally, any response information which is responsive to the notice (that is, for example, information on how the disorder should be treated or software data concerning the treatment) as well as a latest software program and maintenance information such as help information, may be supplied from the vendor. The data communication between each factory 102–104 and the vendor 101 as well as the data communication through the LAN 111 in each factory, may use a communication protocol (TCP/IP) generally used in the internet. In the place of using the internet, an exclusive line network (e.g., ISDN) controlled with strictest security that access by a third party is not allowed, may be used. Further, the host control system is not limited to the system as provided by the vendor. A database may be structured by the user and it may be set in an outside network, such that is can be accessed from plural user factories.

Figure 9:
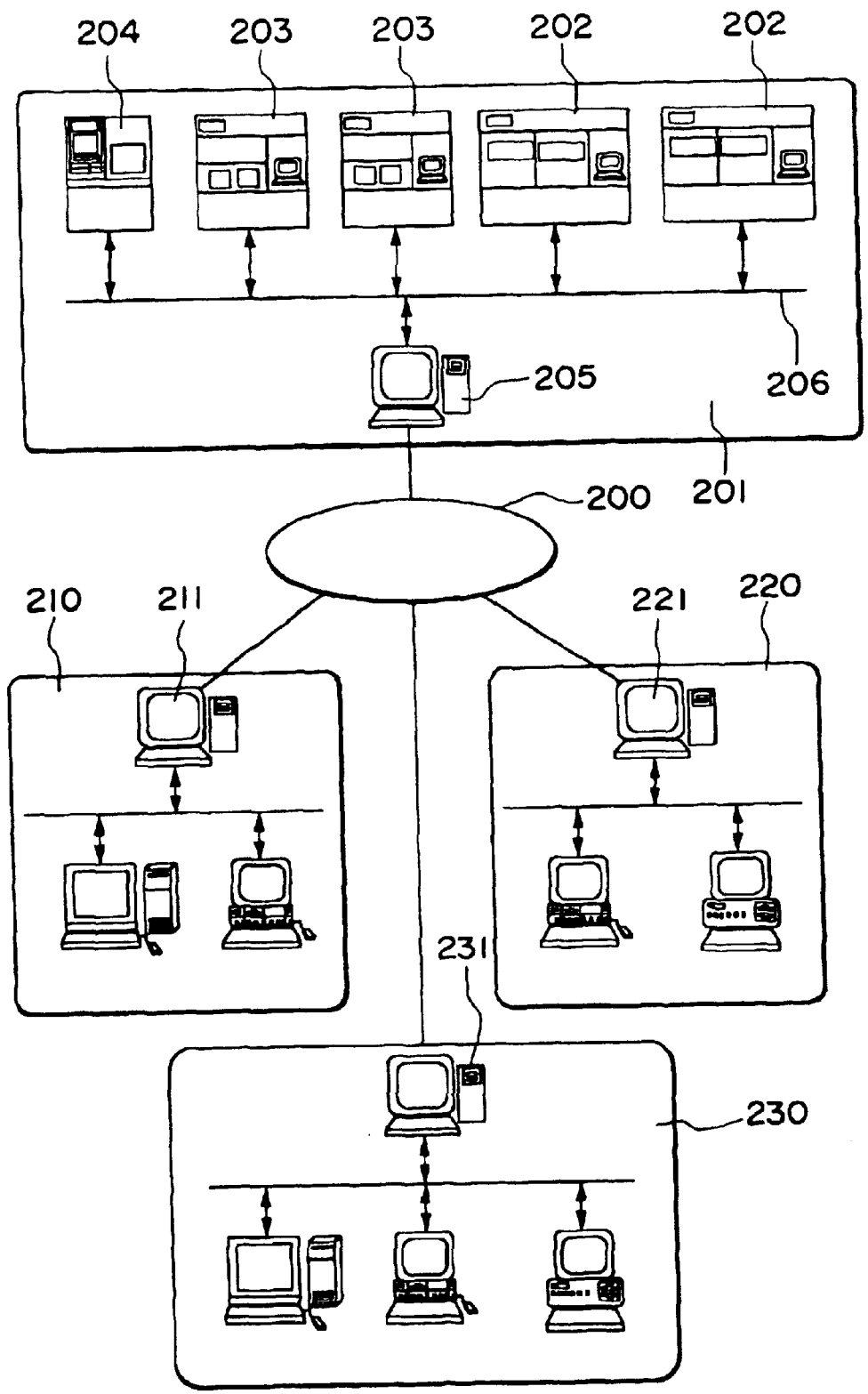
FIG. 9 is a schematic view of a semiconductor device manufacturing system, as viewed in another aspect thereof.

FIG. 9 is a schematic view of a general structure of the production system according to this embodiment, in another aspect thereof different from that of FIG. 8. In the preceding example, plural user factories each having production machines and the control system of the vendor of the production machines are connected with each other through an external network, so that, through this external network, information related to the production control in each factory or information related to at least one production machine can be data communicated. In this example, as compared therewith, a factory having production machines supplied from different vendors and control systems of these vendors corresponding to the user production machines are connected with each other through an external network, outside the factory, so that the maintenance information for these production machines can be data communicated.

Denoted in the drawing at 201 is a manufacturing factory of a production machine user (i.e., a semiconductor device manufacturer). Along the production line in the factory, there are many production machines for performing various processes, that is, in this example, an exposure apparatus 201, a resist processing apparatus 203, and a film formation processing apparatus 204 introduced. Although only one factory 201 is illustrated in the drawing, in practice, plural factories may be arranged into the network. Each production machine in the factory is connected through a LAN 206 to constitute an intranet. The operation of the production line is controlled by a host control system 205.

On the other hand, in the business offices of vendors (machine supplying makers) such as an exposure apparatus manufacturer 210, a resist processing machine manufacturer 220, and a film forming machine manufacturer 230, for example, there are host control systems 211, 221 and 213 for performing remote control maintenance for the machines they supplied. Each of these host control systems is equipped with a maintenance database and a gateway for the outside network. The host control system 205 for controlling the machines in the user factory and the control systems 211, 221 and 231 of the machine vendors are connected with each other through the external network 200 (internet) or an exclusive line network. If, in this production system, any disorder occurs in any one of the production machines in the production line, the operation of the production machine is stopped. However, this can be met quickly through the remote control maintenance for the disordered machine, from the corresponding machine vendor and by way of the internet 200. Therefore, the suspension of the production line is short.

Figure 10:
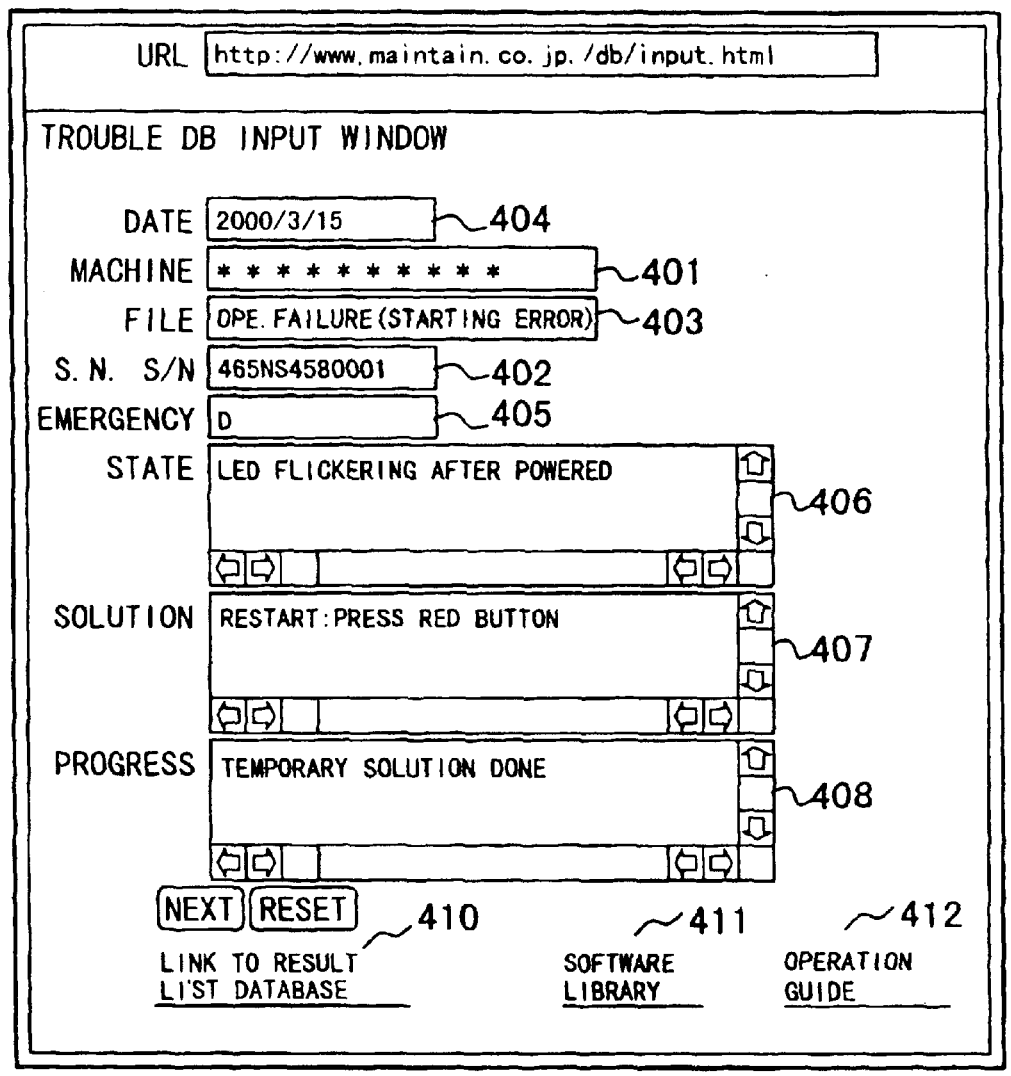
FIG. 10 is a schematic view for explaining an example of a user interface.
Figure 11:
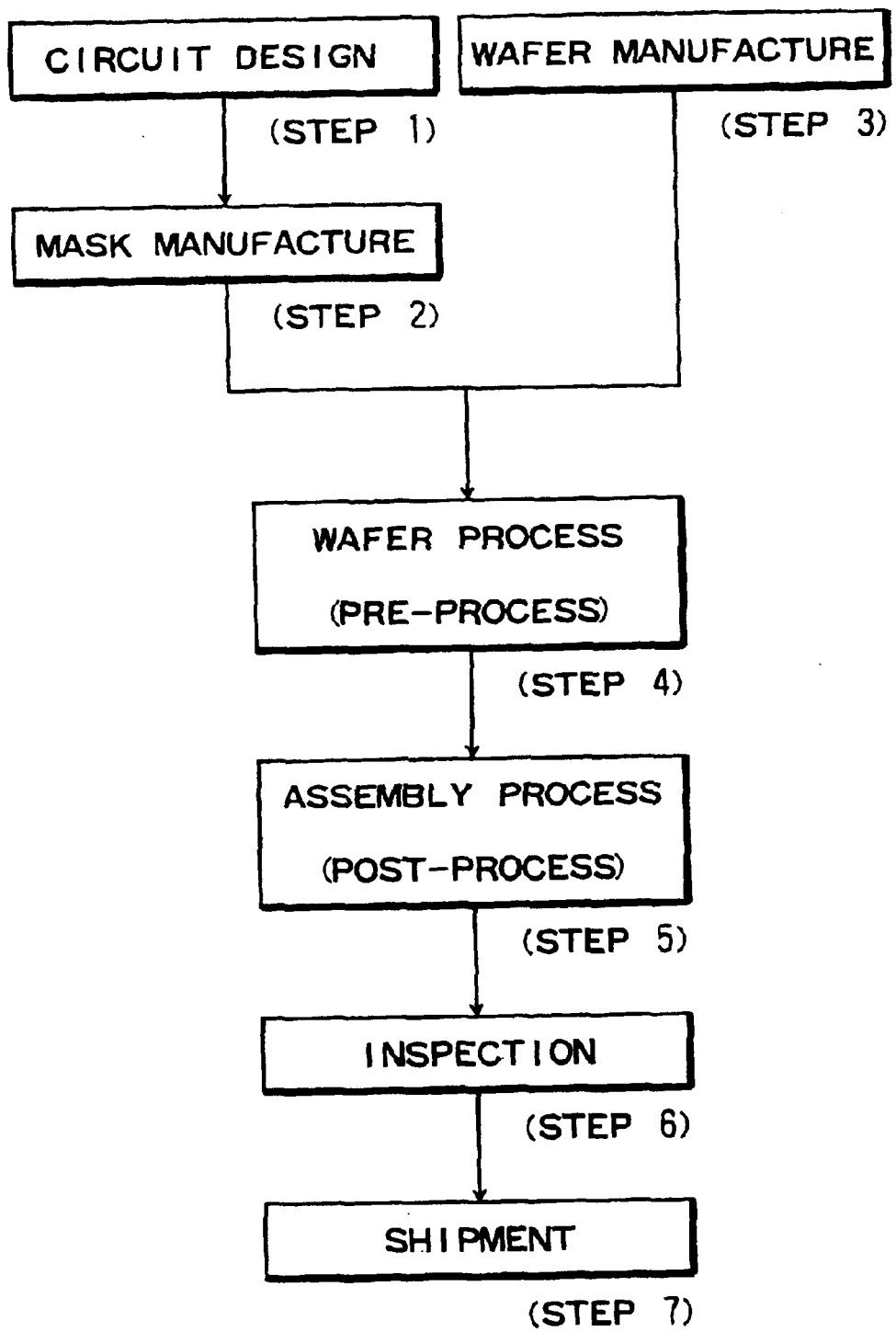
FIG. 11 is a flow chart for explaining device manufacturing processes.

Each of the production machines in the factory may have a display, a network interface and a computer for executing network accessing software, stored in a storage device, as well as machine operating software. The storage device may be an internal memory or a hard disk or, alternatively, it may be a network file server. The network accessing software may include an exclusive or wide-use web browser, and a user screen interface such as shown in FIG. 10, for example, may be provided on the display. Various data may be inputted into the computer (input zones on the screen) by an operator who controls the production machines in each factory, such as, for example, machine type (401), serial number (402), trouble file name (403), date of disorder (404), emergency level (405), status (406), solution or treatment (407), and progress (408). The thus inputted information is transmitted to the maintenance database through the internet. In response, appropriate maintenance information is replied from the maintenance database to the user's display. Further, the user interface as provided by the web browser enables a hyperlink function (410–412) as illustrated. As a result, the operator can access further details of information in each item, or he/she can get a latest version software to be used for the production machine, from the software library as provided by the vendor. Alternatively, the operator can get an operation guide (help information) prepared for factory operators.

Next, a semiconductor device manufacturing process which uses the production system described above, will be explained.

Figure 12:
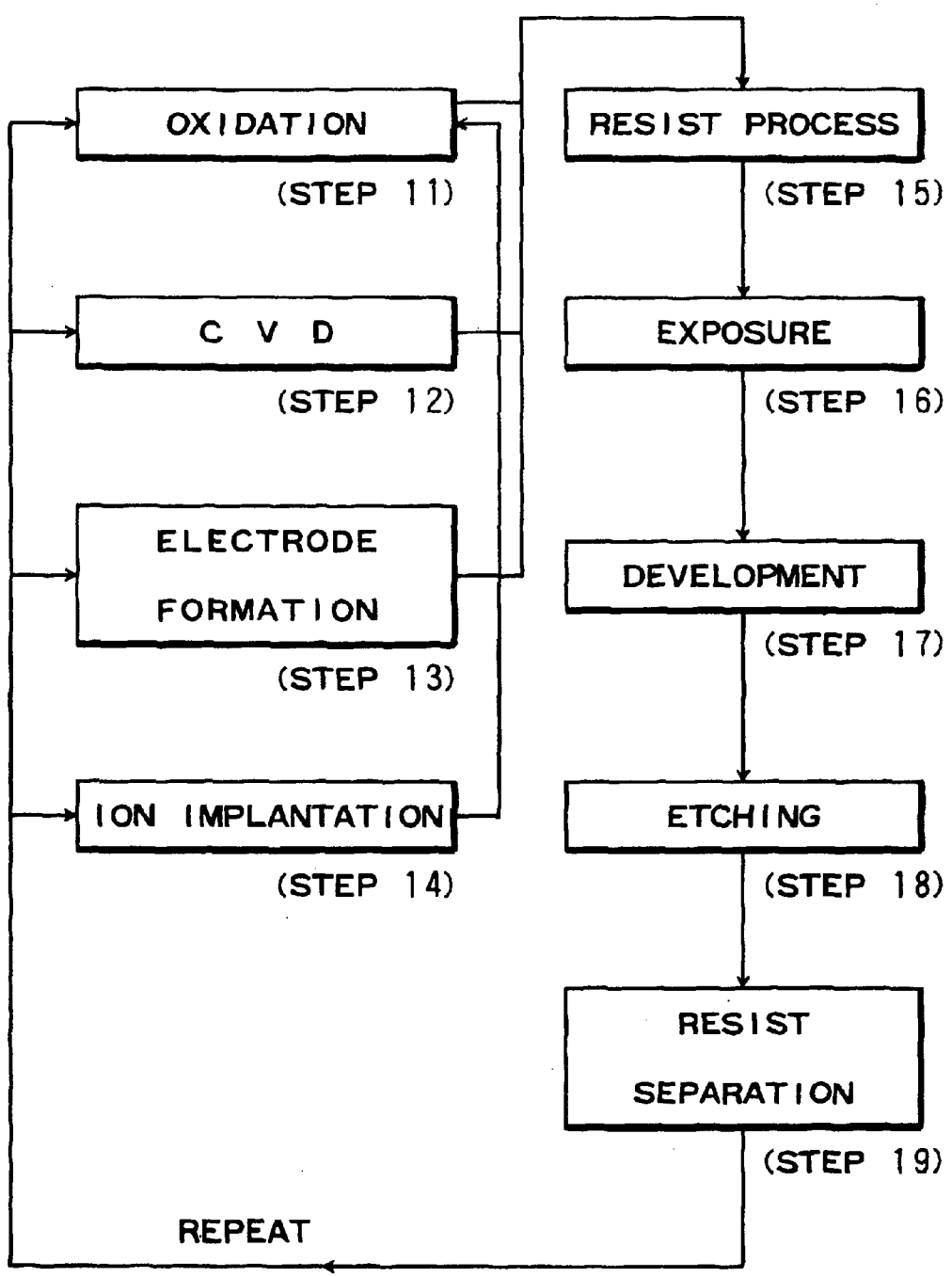
FIG. 12 is a flow chart for explaining details of a wafer process in the procedure of the flow chart of FIG. 11.

FIG. 12 is a flow chart of a general procedure for the manufacture of microdevices.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5 are carried out. With these processes, semiconductor devices are completed and they are shipped (step 7).

The pre-process and the post-process may be performed in separate exclusive factories. In each factory, the maintenance is carried out on the basis of the remote maintenance system described hereinbefore. Further, between the pre-process factory and the post-process factory, data communication for the information related to the production control and the machine maintenance may be done by use of the internet or an exclusive line network.

FIG. 13 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Since the machines used in these processes are maintained through a remote maintenance system as described above, any disorder may be prevented beforehand. If it occurs, it can be met quickly. Therefore, the device productivity can be improved significantly.

In a moving system and a stage according to the present invention, a reaction force during acceleration or deceleration as a movable portion moves is received by a stator. The stator having the reaction force received moves, by which the reaction force is converted into a kinetic energy of the stator, whereby the stator functions as a reaction force counter. With this structure, vibration of the machine reference structure produced by the reaction force of the moving system or the stage can be prevented. Also, since the two stators move along the machine reference structure, in accordance with the acceleration of the moving element, any biased load as the moving element moves can be made small.

In accordance with an exposure apparatus having a stage described above, the influence of vibration or swinging motion resulting from the motion of the stage can be reduced, such that the overlay precision, the linewidth precision, and the throughput can be improved. Further, since the biased load as the moving element moves can be made smaller, the overlay precision can be improved. Further, because the influence of the reaction force, due to the acceleration or deceleration of the stage, can be reduced, the influence to the other machines placed on the same floor, can be made smaller. Also, enlargement of the area to be occupied by the apparatus can be prevented.

Second, in an exposure apparatus of the present invention using ultraviolet light, the purge space around a reticle stage can be made compact and, therefore, the replacement time is shortened. Also, since the stator is outside the purge space, the effect of degassing of the stator is avoided. The transmission factor at the path of ultraviolet light, more particularly, fluorine laser, as well as the stability of the same are assured. As a result, high precision and high throughput exposures are accomplished.

While the invention has been described with reference to the structures disclosed herein, it is not confined to the details set forth and this application is intended to cover such modifications or changes as may come within the purposes of the improvements or the scope of the following claims.

What is claimed is:

1. A moving mechanism, comprising:
   a reference structure having a guide surface;
   a movable member being movable along the guide surface; and
   a plurality of actuators disposed on opposite sides of said movable member,
   wherein each of said plurality of actuators has a movable element and a stator for driving said movable member two-dimensionally along the guide surface, each of the movable elements of said plurality of actuators is movable together with said movable member, and each of the stators of said plurality of actuators is movable two-dimensionally by a reactor force produced in response to the driving of the movable member.

2. A moving mechanism according to claim 1, wherein said stators are movable along the guide surface.

3. A moving mechanism according to claim 1, wherein said stators are movable in two-dimensional direction along the guide surface.

4. A moving mechanism according to claim 1, wherein each of said actuator is a linear motor having a movable element and a stator.

5. A moving mechanism according to claim 4, wherein the stator of said linear motor is provided by a coil, and the movable element of said linear motor is provided by a permanent magnet.

6. A moving mechanism according to claim 4, wherein the stator of said linear motor is provided by a permanent magnet, and the movable element of said linear motor is provided by a coil.

7. A moving mechanism according to claim 1, further comprising a position measuring device and a driving mechanism, for positioning a reaction force counter being moved along a plane due to a drive reaction force of said movable portion as received by the stators.

8. A stage having a moving mechanism as recited in claim 1, and having a position measuring device and a driving mechanism for positioning a movable portion.

9. A stage according to claim 8, further comprising an actuator for controlling the position of the stator.

10. A stage according to claim 8, wherein said stage is movable in six-axis directions and having a θ and Z tilt stage mounted thereon.

11. An exposure apparatus, comprising:
    exposure means for projecting a portion of a circuit pattern on a substrate through a projection optical system, and for printing a predetermined exposure region of the pattern of the original onto the substrate; and
    a stage as recited in claim 8, for moving at least one of the original and the substrate for exposure thereof.

12. An apparatus according to claim 11, wherein the exposure is performed by scanning exposure in which the original and the substrate are scanningly moved relatively to the projection optical system, whereby a predetermined exposure region of the pattern of the original is scanningly printed on the substrate, and wherein, for the scan, at least one of the original and the substrate is moved by said stage.

13. An apparatus according to claim 11, wherein said stage is connected to a barrel base on which the projection optical system is mounted.

14. An apparatus according to claim 11, wherein ultraviolet light is used as exposure light.

15. An apparatus according to claim 14, wherein the ultraviolet light is laser light from a laser source.

16. An apparatus according to claim 15, wherein the laser light is fluorine excimer laser.

17. An apparatus according to claim 15, wherein the laser light is from an ArF excimer laser.

18. An apparatus according to claim 11, wherein, in said stage, the relation between a stator and a movable element of a linear motor is based on an open structure, and wherein a shielding wall is provided inside the stator, said shielding wall extending from at least one of an illumination optical system and a projection optical system to the substrate structure, while enclosing a movable portion having the movable element, the inside space being purged by use of an inactive gas.

19. An apparatus according to claim 18, wherein an interferometer for use as position measuring means is provided in a purge area inside the shielding wall.

20. An apparatus according to claim 19, wherein the interferometer includes a reaction force counter and the reaction force counter is supported by an actuator for producing a thrust in a straight direction, and wherein a drive reaction force in the straight direction is received by a reaction force receiving structure being supported by the floor, separately from the stage base.

21. A device manufacturing method, comprising the steps of:
providing a group of production machines for performing various processes, including an exposure apparatus as recited in claim 11, in a semiconductor manufacturing factory; and
producing a semiconductor device by performing plural processes using the production machine group.

22. A method according to claim 21, further comprising (i) connecting the production machines of the group with each other through a local area network, and (ii) executing data-communication concerning information related to at least one production machine of the production machine group, between the local area network and an external network outside the semiconductor manufacturing factory.

23. A method according to claim 21, wherein a database provided by a vendor or a user of the exposure apparatus can be accessed through the external network so that maintenance information related to the production machine can be obtained through the data communication, and wherein production control can be performed on the basis of data communication through the external network and between the semiconductor factory and a separate semiconductor factory.

24. A semiconductor manufacturing factory, comprising:
a group of production machines for performing for various processes, including an exposure apparatus as recited in any one of claims 11–20;
a local area network for connecting the production machines of the production machine group with each other; and
a gateway for enabling an access from the local area network to an external network outside the factory;
wherein information related to at least one production machine in the group can be data communicated by use of the local area network and the gateway.

25. A method of executing maintenance for an exposure apparatus as recited in any one of claims 11–20, provided in a semiconductor manufacturing factory, said method comprising the steps of:
providing, by a vendor or a user of the exposure apparatus, a maintenance database connected to an external network outside the semiconductor manufacturing factory;
admitting access from the semiconductor manufacturing factory to the maintenance database through the external network; and
transmitting maintenance information stored in the maintenance database to the semiconductor manufacturing factory through the external network.

26. An apparatus according to claim 11, further comprising a display, a network interface and a computer for executing a network software, wherein maintenance information related to said exposure apparatus is data communicated through the computer network.

27. An apparatus according to claim 26, wherein the network software provides on the display a user interface for accessing a maintenance database prepared by a vendor or a user of said exposure apparatus and connected to an external network outside a factory where said exposure apparatus is placed, thereby to enable obtaining information from the database through the external network.

28. An X-Y stage comprising:
a reference structure having a guide surface;
a first movable portion being movable in an X-axis direction along the guide surface;
a first actuator having first movable elements, provided at opposite end portions of said first movable portion, and first stators being movable;
a second movable portion being movable in a Y-axis direction along the guide surface;
a second actuator having second movable elements, provided at opposite end portions of said second movable element, and second stators being movable; and
a stage provided at an intersection defined between said first and second movable portions,
wherein said first stators are separated from each other and said second stators are separated from each other, and each stator is movable in two-dimensional directions by a reaction force produced as an associated movable portion is driven.

29. An X-Y stage according to claim 28, wherein said first stators are disposed along the X-axis direction while said second stators are disposed along the Y-axis direction.

30. A moving mechanism according to claim 28, wherein said stators are movable along the guide surface.

31. A moving mechanism according to claim 28, wherein said stators are movable in the two-dimensional directions along the guide surface.

32. A moving mechanism according to claim 28, wherein said actuator is a linear motor having a movable element and a stator.

33. A moving mechanism according to claim 32, wherein the stator of said linear motor is provided by a coil, and the movable element of said linear motor is provided by a permanent magnet.

34. A moving mechanism according to claim 32, wherein the stator of said linear motor is provided by a permanent magnet, and the movable element of said linear motor is provided by a coil.

35. A moving mechanism according to claim 28, further comprising a position measuring device and a driving mechanism, for positioning a reaction force counter being moved along a plane due to a drive reaction force of said movable portion as received by the stators.

36. A moving mechanism, comprising:
a stage being movable two-dimensionally; and
a plurality of actuators having movable elements being movable two-dimensionally together with said stage and stators being independently movable in two dimensions by a reaction force produced in response to the driving of said stage, wherein said plurality of actuators are disposed on opposite sides of said stage, and each of said plurality of actuators is adapted to drive the movable element relative to the stator in the first and second directions.

37. A moving mechanism according to claim 36, wherein each of said plurality of actuators includes permanent magnet means and coil means, for driving the movable element relative to the stator in the first and second directions, wherein one of said permanent magnet means and said coil means is provided on the movable element while the other is provided on the stator.

38. A moving mechanism according to claim 37, wherein said coil means includes a first coil for driving the movable element relative to the stator in the first direction, and a second coil for driving the movable element relative to the stator in the second direction.

39. A moving mechanism according to claim 38, wherein said permanent magnet means includes a first permanent magnet cooperable with said first coil, and a second permanent magnet cooperable with said second coil.

40. An exposure apparatus for exposing a substrate through an original, said apparatus comprising:

a stage for moving the original or the substrate two-dimensionally; and a plurality of actuators having movable elements being movable two-dimensionally together with said stage and stators being independently movable in two dimensions by a reaction force produced in response to the driving of said stage, wherein said actuator is adapted to drive said movable element relative to said stator in first and second directions.

41. An apparatus according to claim 40, wherein said actuator includes permanent magnet means and coil means, for driving the movable element relative to the stator in the first and second directions, and one of said permanent magnet means and said coil means is provided on the movable element while the other is provided on the stator.

42. An apparatus according to claim 41, wherein said coil means includes a first coil for driving the movable element relative to the stator in the first direction, and a second coil for driving the movable element relative to the stator in the second direction.

43. An apparatus according to claim 42, wherein said permanent magnet means includes a first permanent magnet cooperable with said first coil, and a second permanent magnet cooperable with said second coil.

44. An apparatus according to claim 40, wherein said stage is moved in the first direction for scan exposure of the substrate through the original, and said apparatus further comprises a position measuring device for measuring the position of the stator with respect to the first direction.

45. An apparatus according to claim 40, further comprising a stator actuator for driving the stator in the first direction.

46. An apparatus according to claim 40, wherein said plurality of actuators are disposed on opposite sides of said stage, and each of said plurality of actuators is adapted to drive said movable element relative to said stator, in first and second directions.

47. A moving mechanism comprising:

a stage being movable in two dimensions; and a plurality of actuators having movable elements being movable in two dimensions with said stage and stators being independently movable in two dimensions by a reaction force produced in response to the driving of said stage, wherein each of said plurality of actuators is adapted to drive the movable element relative to the stator in two directions.

48. A moving mechanism according to claim 47, wherein said plurality of actuators are disposed on opposite sides of said stage.

49. A moving mechanism according to claim 48, wherein each of said plurality of actuators includes permanent magnet means and coil means, for driving the movable element relative to the stator, wherein one of said permanent magnet means and said coil means is provided on the movable element while the other is provided on the stator.

50. A moving mechanism according to claim 49, wherein said coil means includes a first coil for driving the movable element relative to the stator in the first direction, and a second coil for driving the movable element relative to the stator in the second direction.

51. A moving mechanism according to claim 50, wherein said permanent magnet means includes a first permanent magnet cooperable with said first coil, and a second permanent magnet cooperable with said second coil.

52. An exposure apparatus for exposing a substrate through an original, said apparatus comprising:

a stage for moving the original or the substrate in two dimensions; and a plurality of actuators having movable elements being movable in two dimensions with said stage and stators being independently movable in two dimensions by a reaction force produced in response to the driving of said stage, wherein each actuator is adapted to drive the movable element relative to the stator in two directions.

53. An apparatus according to claim 52, wherein said plurality of actuators are disposed on opposite sides of said stage.

54. An apparatus according to claim 53, wherein said stage is moved in a scanning direction for scan exposure of the substrate through the original, and wherein said apparatus further comprises a position measuring device for measuring the position of the stator with respect to the scanning direction.

55. An apparatus according to claim 54, further comprising a stator actuator for moving the stator in the scanning direction.

56. An exposure apparatus for exposing a substrate through an original, said apparatus comprising:

a stage for moving the original or the substrate two-dimensionally; and an actuator having a movable element being movable two-dimensionally together with said stage and a stator being movable two-dimensionally by a reaction force produced in response to the driving of said stage, wherein said actuator is adapted to drive said movable element relative to said stator in first and second directions, and said stage is moved in the first direction for scan exposure of the substrate through the original, and said apparatus further comprises a position measuring device for measuring the position of the stator with respect to the first direction.

* * * * *

UNITED STATES PATENT AND TRADEMARK OFFICE
CERTIFICATE OF CORRECTION

PATENT NO. : 6,717,653 B2
DATED : April 6, 2004
INVENTOR(S) : Kazunori Iwamoto et al.

It is certified that error appears in the above-identified patent and that said Letters Patent is hereby corrected as shown below:

Column 8,
Line 49, "9" should read -- $\theta$ --.

Column 16,
Line 14, "actuator" should read -- actuators --.

Column 18,
Lines 33, 35, 38, 41, 45 and 49, "A moving mechanism" should read -- An X-Y stage --.

Signed and Sealed this

Twenty-fourth Day of August, 2004

JON W. DUDAS
*Director of the United States Patent and Trademark Office*